(12) United States Patent
Link

(10) Patent No.: US 6,530,146 B2
(45) Date of Patent: Mar. 11, 2003

(54) APPARATUS FOR MOUNTING A FLIPCHIP ON A WORK PIECE

(75) Inventor: Daniel Link, Baar (CH)

(73) Assignee: Esec Trading SA, Cham (CH)

( * ) Notice: Subject to any disclaimer, the term of this patent is extended or adjusted under 35 U.S.C. 154(b) by 0 days.

(21) Appl. No.: 09/871,110

(22) Filed: May 31, 2001

(65) Prior Publication Data
US 2001/0054229 A1 Dec. 27, 2001

(30) Foreign Application Priority Data
Jun. 22, 2000 (EP) ............................... 00810550

(51) Int. Cl.$^7$ ............................................. B23B 19/00
(52) U.S. Cl. .......................... 29/740; 29/720; 29/833; 29/834; 29/832; 294/68.2
(58) Field of Search ..................... 29/740, 741, 759, 29/833, 832, 755, 721, DIG. 44, 720, 834; 294/2, 64.1, 68.2; 414/752; 356/152.2, 152.3, 601; 250/559.08, 559.33

(56) References Cited

U.S. PATENT DOCUMENTS

| | | | | |
|---|---|---|---|---|
| 5,233,745 A | * | 8/1993 | Morita | ................. 29/705 |
| 5,379,514 A | * | 1/1995 | Okuda et al. | ............ 29/833 |
| 5,768,759 A | | 6/1998 | Hudson | |
| 5,864,944 A | | 2/1999 | Kashiwagi et al. | |
| 5,894,657 A | * | 4/1999 | Kanayama et al. | .......... 29/740 |
| 6,205,636 B1 | * | 3/2001 | Abe et al. | ................ 29/407.1 |
| 6,285,787 B1 | * | 9/2001 | Kawachi et al. | .......... 382/209 |
| 6,311,391 B1 | * | 11/2001 | Fuke et al. | ............... 29/740 |
| 6,337,489 B1 | * | 1/2002 | Matsumoto et al. | ... 250/559.08 |
| 2001/0054229 A1 | * | 12/2001 | Link | ........................... 29/740 |

FOREIGN PATENT DOCUMENTS

| | | | | |
|---|---|---|---|---|
| EP | 449 481 A1 | | 10/1991 | |
| JP | 2-143499 | * | 6/1990 | ............... 29/833 |
| JP | 01095988 | | 11/1990 | |
| JP | 5-299890 | * | 11/1993 | ............... 29/720 |

* cited by examiner

Primary Examiner—Peter Vo
Assistant Examiner—Minh Trinh
(74) Attorney, Agent, or Firm—McCormick, Paulding & Huber LLP

(57) ABSTRACT

An apparatus for mounting a flipchip onto a work piece comprises a pick-up station for presentation of the flipchip, a transport mechanism, at least one pick-up tool arranged on the transport mechanism for pick-up and transport of the flipchip from the pick-up station to the work piece and a position acquisitioning device arranged on the transport mechanism for determining the position of the picked up flipchip. The position acquisitioning device comprises a slide and a single line camera secured to the slide, a guide element for guiding the slide, a drive mechanism for driving the slide and a measuring device for determining the position of the slide.

8 Claims, 2 Drawing Sheets

APPARATUS FOR MOUNTING A FLIPCHIP ON A WORK PIECE

Figure 1:
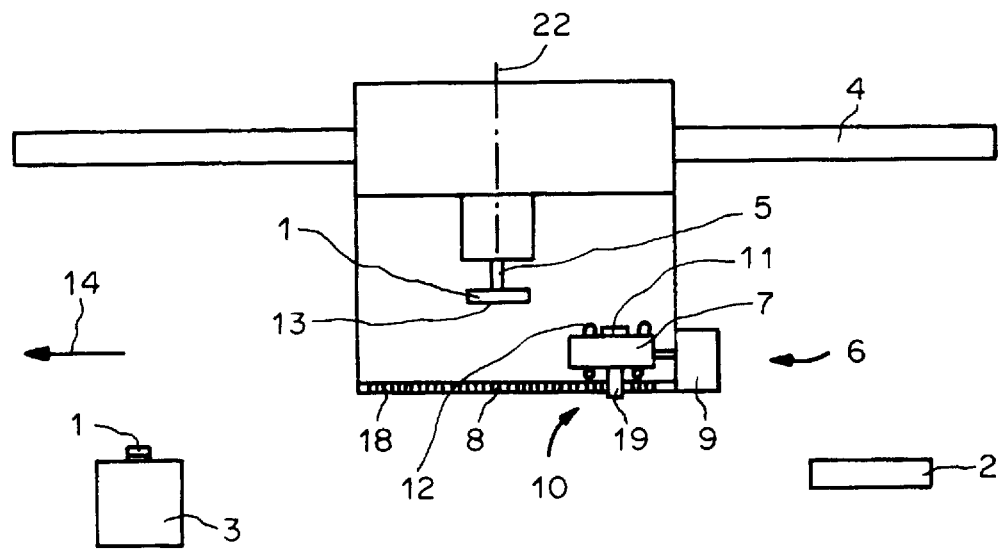

The invention concerns an apparatus for mounting a flipchip on a work piece.

BACKGROUND OF THE INVENTION

For mounting onto a work piece, for example a BGA® substrate or a printed circuit board, semiconductor chips are normally presented so that their active surface is facing upwards. However, certain semiconductor chips, in particular microprocessors, have to be turned (flipped) before mounting on the work piece so that their active surface faces towards the work piece. For this reason, such semiconductor chips are generally called flipchips. In order that the structures of the flipchip match the structures of the work piece, the position and orientation of the structures of the flipchip as well as the structures of the work piece have to be determined before placing the flipchip onto the work piece.

Under the name of Micron, the applicant markets an apparatus for mounting flipchips with which the flipchip is first flipped, then picked up by a pick-up tool and transported to a stationary position acquisitioning device where it is measured and then finally transported to the work piece and placed. A conventional CCD camera with, for example, 480×640 pixels serves as the position acquisitioning device. The stationary arrangement of the position acquisitioning device results in a time loss as each flipchip must first be transported to the position acquisitioning device and only after this can it be transported to the work piece.

In order to avoid this time loss, in Patent Specification U.S. Pat. No. 5,768,759 it has been suggested to arrange a stationary mirror close to the work piece and a camera next to the pickup tool so that, on crossing the mirror, the active surface of the picked up flipchip is located in the field of vision of the camera. Up till now, technological difficulties have prevented the practical realisation of this solution.

The object of the invention is to accelerate the acquisition of the position and orientation of the flipchip during mounting and thereby increase the capacity of the automatic assembly machine.

BRIEF DESCRIPTION OF THE INVENTION

An apparatus for mounting a flipchip onto a work piece comprises at least one pick-up station where the flipchips are presented, a transport mechanism movable in horizontal x and y directions with a pick-up tool for pick-up and transport of the flipchip from the pick-up station to, the work piece, and a position acquisitioning device arranged on the transport mechanism for determining the position and orientation of the picked up flipchip. In accordance with the invention, a single line camera is foreseen as the position acquisitioning device which, during the transport of the flipchip from the pick-up station to the work piece, is moved across under the flipchip where it scans an image of the surface of the flipchip and transmits it to an image processing module. For this purpose, a linear guide element for guiding a slide movable in a predetermined direction, a drive mechanism for driving the slide and a measuring device for determining the position of the slide are foreseen on the transport mechanism. The single line camera is secured to the slide and its field of vision is directed upwards towards the active surface of the flipchip.

In the following, embodiments of the invention are explained in more detail based on the drawing.

BRIEF DESCRIPTION OF THE DRAWING FIGURES

It is shown in:
FIG. 1 an apparatus for mounting a flipchip onto a work piece,
FIG. 2 parts of this device,
FIG. 3 a scanning area,
FIG. 4 a further device for mounting a flipchip, and
FIG. 5 a facility for illuminating the flipchip.

DETAILED DESCRIPTION OF THE INTENTION

FIG. 1 shows a schematic presentation of an apparatus for mounting a flipchip 1 onto a work piece 2. The device comprises at least one pick-up station 3 where the flipchips 1 are presented, a transport mechanism 4 with a pick-up tool 5 for pick-up and transport of the flipchip 1 from the pick-up station 3 to the work piece 2, and a position acquisitioning device 6 arranged (on the transport mechanism 4 for determining the position and orientation of the picked up flipchip 1. The position acquisitioning device 6 comprises a movable slide 7, a linear guide element 8 secured to the transport mechanism 4 for guiding the slide 7, a drive mechanism 9 for driving the slide 7 and a measuring device 10 for determining the position of the slide 7. The slide 7 has a single line camera 11 and illumination facilities 12.

The supply and presentation of the flipchips 1 can take place in various ways. A first possibility exists in presenting the flipchips 1 not flipped as normal semiconductor chips, ie, with the active surface 13 facing upwards, on a tape tensioned on a frame and feeding them to a flipper by means of a wafer table. The flipper grasps one semiconductor chip after the other, flips it and presents it for pick-up by the pick-up tool 5. In this case, the flipper serves as pick-up station 3. A second possibility exists in flipping the semiconductor chips previously on another machine and filling them into pockets on a carrier tape which is wound on a reel. In this case, a feeder unit such as is known, for example, from the European patent application EP 859544 serves as the pick-up station. The flipchips 1 can however be supplied in other ways.

In this way, the pick-up tool 5 grips the flipchip 1 at the pick-up station 3 on its back so that its active surface 13 faces downwards. The field of vision of the single line camera 11 is aligned facing upwards towards the pick-up tool 5 and therefore towards the active surface 13 of the picked up flipchip 1.

Figure 2:
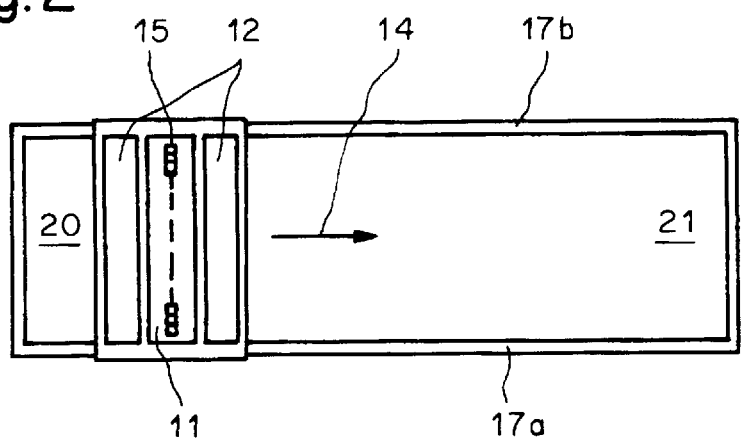

The guide element 8 enables the movement of the slide 7 in a predetermined direction of movement 14 which is aligned parallel to a transport direction of the transport mechanism 4. FIG. 2 shows a plan view of the alignment of the single line camera 11 in relation to the movement direction 14 of the slide 7. The single line camera 11 comprises light sensitive photosensors 15 (of which only a few are presented) which are arranged next to each other along a line 16 (or row). The number of photosensors 15 amounts for example to m=1024, whereby each photosensor 15 is allocated al index value between k=1 and k=m. The dimensions of one single photosensor amount for example to 28 $\mu$m×28 $\mu$m. The line 16 runs orthogonally to the movement direction 14. The illumination facilities 12 serve the uniform illumination of the flipchip 1 during scanning.

The guide element 8 essentially comprises a rectangular shaped frame with two guide rails 17a and 17b running parallel to the movement direction 14. Alternatively, one single guide rail could be foreseen on which the slide 7 glides back and forth. (In FIG. 2 the guide rail 17b and the two narrow sides of the frame are then omitted). The drive mechanism 9 consists for example of a motor secured to the frame which drives the slide 7 via a toothed belt. The measuring device 10 (FIG. 1) for determining the position of the slide 7 comprises a linear encoder, for example a metal or glass rule 18 (FIG. 1), mounted on the guide rail 17a and a measuring head 19 (FIG. 1) secured to the slide, for reading the metal or glass rule 18. By means of the drive mechanism 9, the slide 7 can be moved from a first limit position 20 located on one side of the pick-up tool 5 to a second limit position 21 located on the opposite side of the pick-up tool 5 as seen in movement direction 14. The output signal of the single line camera 11 is transmitted to an image processing module which forms a two dimensional picture from the linewise transmitted image lines and subsequently from this picture determines the position and orientation of the picked up flipchip 1 in a known way.

Particular importance is given to the synchronisation of the movement of the slide 7 with the single line camera 11. The synchronisation preferably takes place by means of the measuring device 10 in the following way: During the movement of the slide 7 from its first limit position 20 to its second limit position 21, its actual position is continuously recorded by means of the measuring device 10. Each time the slide 7 reaches a predetermined position pi whereby the index i designates a whole number and runs for example from i=1 up to i=n, the single line camera 11 is triggered to record a new image line $b_i$. Afterwards, the image line $b_i$ is transmitted to the image processing module. The scanning area of the single line camera 11 can therefore be assigned a pixel matrix of m*n pixels whereby each pixel is defined by means of the two indices i and k.

In order to achieve a perfect image, the distance A between consecutive positions pi and $p_{i+1}$ must correspond to the size of the photosensors 15. The pixel co-ordinates ($x_i$, $y_k$) of the centre of the pixel with the pixel indices (i, k) then result in $x_i=(i-½)*A$ and $y_k=(k-½)*A$. In the present example, the distance A has the value A=28 μm.

In order to be able to place the picked up flipchip 1 in the correct position on the work piece 2, the position and orientation or any shifting and/or rotation of the picked up flipchip 1 in relation to the pick-up tool 5 or the axis of symmetry 22 running through the tip of the pick-up tool 5 must first be determined and the position of the axis of symmetry 22 must be known in a system of global machine co-ordinates. Calibration of the position of the symmetrical axis 22 in relation to the system of global machine co-ordinates takes place in a known way and is not explained here. The relationship between the pixel co-ordinates ($x_i$, $y_k$) of the position acquisitioning device 6 and the axis of symmetry 22 of the pick-up tool 5 is determined in that the slide 7 is moved across under the pick-up tool 5 whereby for predetermined values of the index i at the corresponding position $p_i$ an image line $b_i$ is recorded, the image lines $b_i$ put together to the image of the pick-up tool 5 and, by means of evaluating the image, the co-ordinates ($x_g$, $y_g$) of the tip of the pick-up tool 5 or of the axis of symmetry 22 running through the tip of the pick-up tool 5 are determined. Afterwards, the pixel co-ordinates ($x_i$, $y_k$) of each pixel (i, k) can be converted into co-ordinates of the global machine co-ordinate system.

In normal operation, the device works according to the following steps:

1. The transport mechanism 4 moves the pick-up tool 5 until it is located above the next flipchip 1 to be placed. The pick-up tool 5 is lowered, the flipchip 1 picked up and the gripper 5 is raised again.
2. The transport mechanism 4 moves the pick-up tool 5 to the target position above the work piece 2 in which, with ideal pick-up by the pick-up tool 5, ie, when the actual and set position of the flipchip 1 correspond, it is correctly placed on the work piece 2. During this movement of the transport mechanism 4, the slide 7 is moved from the first limit position 20 to the second limit position 21 and, at the same time, an image of the picked up flipchip 1 is recorded. As soon as the image composed from the image lines has been completely acquired, it is used to determine the position and orientation of the flipchip 1 in relation to the pickup tool 5. Any rotation of the flipchip 1 in relation to its set position is corrected by turning the pick-up tool 5 on its vertical running axis of symmetry 22 (FIG. 1) while any shifting in relation to its set position is corrected by moving to h new target position above the work piece 2.
3. Placing the flipchip 1 on the work piece 2.

During the return travel of the transport mechanism 4, the position of the pick-up tool 5 can be recalibrated, ie, the co-ordinates ($x_g$, $y_g$) of the axis of symmetry 22 are redefined so that any temperature drift in the position of the pick-up tool 5 can be continuously corrected.

Figure 3:
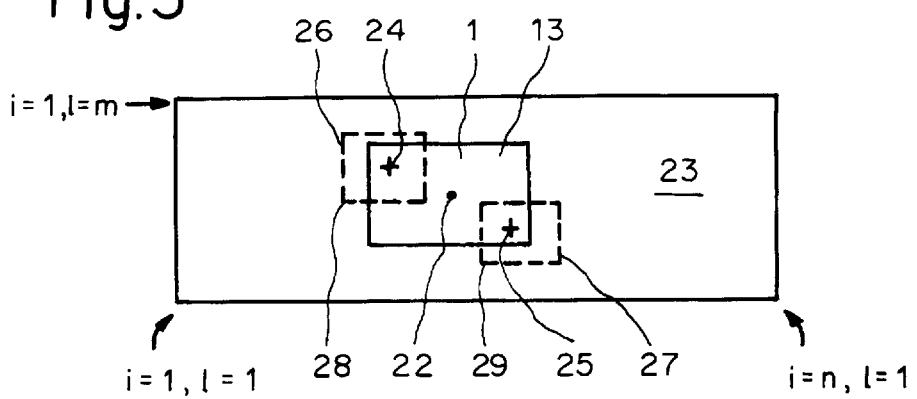

Certain optimization possibilities are now explained based on FIG. 3. FIG. 3 shows the scanning area 23 of the single line camera 11, the axis of symmetry 22 of the pick-up tool 5, the flipchip 1 gripped by the pick-up tool 5 with two diagonally offset structures 24 and 25 for determining its position and orientation, so-called fiducials, and two virtual windows 26 and 27. The scanning area 23 consists of the n image lines at m pixels each. In order to receive the information concerning the position and orientation of the flipchip 1, it is not necessary to travel over the entire scanning area 23 as it is sufficient when the single line camera 11 scans the area of the two windows 26 and 27 or only provides data which belong to the two windows 26 and 27. Preferably, the two windows 26 and 27 have a predetermined size of h*q pixels, for example h=480*q=640 pixels. The position of each of the two windows 26 and 27 is determined according to the position of the structures 24 and 25 and is completely defined by means of the pixel co-ordinate information of a reference point 28 or 29, for example the bottom left corner point. In the example in FIG. 3 the reference point 28 of window 26 has the pixel co-ordinates i=435, k=1320, reference point 29 of window 27 has the pixel co-ordinates i=1212, k=100 and the axis of symmetry 22 of the pick-up tool 5 has the pixel co-ordinates i=800, k=1006.

In operation, the single line camera 11 is controlled so that it firstly scans the area of positions $P_{435}$ to $P_{1074}$ each time transmitting the brightness values of pixels k=1320 to k=1899 to the image processing module to form an image of the first window 26 and that afterwards it scans the area of positions $P_{1212}$ to $P_{1851}$ each time transmitting the brightness values of pixels k=100 to k=579 to the image processing module to form an image of the second window 27. In the image processing module, the positions of the structures 24 and 25 are determined from the two images and from these the position and orientation of the flipchip 1 are determined.

With the example presented, the dimensions of the photosensors 15 and therefore the size of the pixels amount to 28 μm×28 μm. With a scanning speed of the slide 7 of 0.5 m/s, 56 μs are available for reading out an image line. This time is sufficient to transmit the 1024 pixels of an image line to the image processing module. The pixel size of the scanned image then amounts to 28 μm*28 μm. With a constant read-out time of 56 μs it is also possible to double the scanning speed of the slide 7 to 1 m/s however, only recording and reading out one image line $b_i$ for every second value of the index i. In this case, the pixel size amounts to 56 μm*28 μm. By means of interpolation, intermediate values are then calculated so that a neighbouring image line with interpolated values can be assigned to each measured image line and then the evaluation of the image can take place in a similar way in, the image processing module.

In order to keep the scanning time as short as possible, the slide 7 is moved with the greatest possible speed in predetermined travel ranges, namely the travel ranges lying outside the two windows 26, 27, ie, it first experiences a strong acceleration and then a strong braking while the slide 7 is moved with a constant, predetermined speed in the travel ranges corresponding to the two windows 26, 27.

Figure 4:
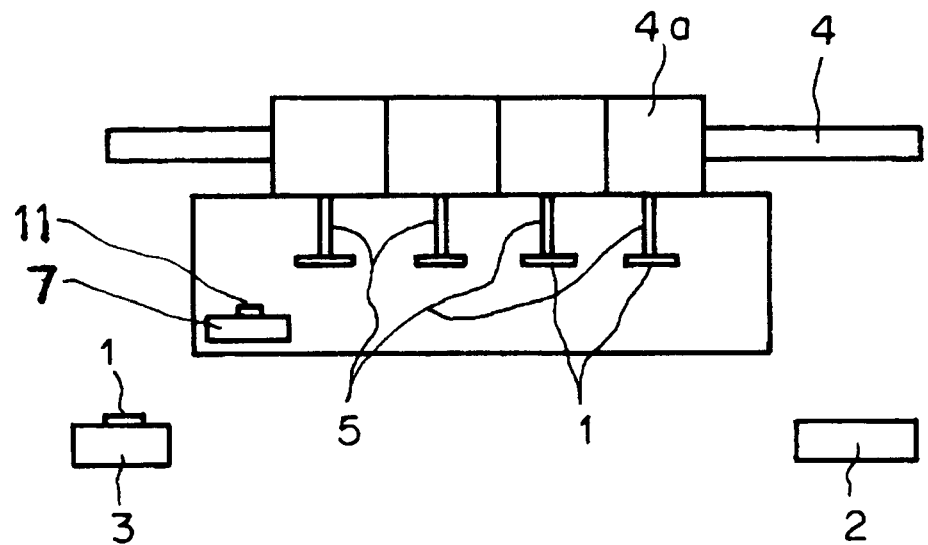

As shown in FIG. 4, instead of one single pick-up tool 5 it is possible and advantageous to foresee several pick-up tools 5 arranged next to each other on the transport mechanism 4, for example two or four, so that in operation several flipchips 1 can be picked up at a time from the pick-up station 3, measured during the transport to the work piece 2 by means of the single line camera 11 and subsequently placed in the correct position on the work piece 2.

Figure 5:
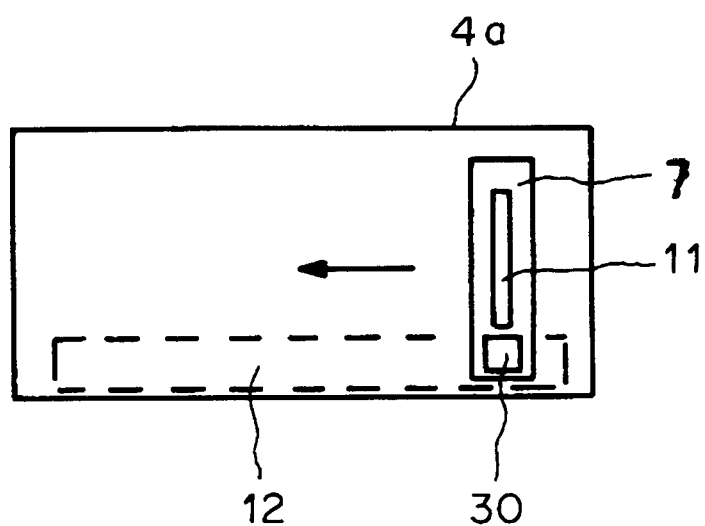

Furthermore, the illumination facilities 12 can be arranged on the movable head 4a of the transport mechanism 4 (FIG. 4). The illumination facilities 12 preferably have a longitudinal shape and are aligned in the movement direction 14 of the slide 7. A mirror 30 is mounted on the slide 7 which reflects the light emitted during scanning by the illumination facilities 12 onto the gripped flipchip 1. FIG. 5 shows a schematic view of the slide 7 with the single line camera 11 and the mirror 30 as well as, with a broken line, the illumination facilities 12 arranged on the transport mechanism 4. In addition, a diffuser can be arranged in the beam path between the illumination facilities 12 and the flipchip 1.

What is claimed is:

1. A device for mounting a flipchip onto a workpiece, comprising:
   a pick-up station for presenting the flipchip,
   a transport mechanism with at least one pick-up tool for pick-up and transport of the flipchip from the pick-up station to the workpiece, and
   a position acquisitioning device for scanning a surface of the picked up flipchip and determining a position and orientation of the picked up flipchip, including:
   an image processing module,
   a slide with a single line camera, the slide being arranged on the transport mechanism, and
   a drive mechanism for driving the slide with the single line camera from a first position located at one side of the flipchip to a second position located at an opposite side of the flipchip for recording single image lines of said surface of the flipchip and transmitting the image lines to the image processing module, the
   image processing module forming a two-dimensional image from the transmitted image lines of the single line camera and determining from the two-dimensional image the position and orientation of the picked up flipchip.

2. The device according to claim 1, further comprising illumination facilities for illumination of the flipchip, which are arranged on the transport mechanism, and a mirror arranged on the slide for deflection of light emitted by the illumination facilities.

3. The device according to claim 1, further comprising a measuring device for measuring an actual position of the slide while the slide is moved from the first location to the second location in order to synchronize a movement of the slide with a recording of the image lines of the single line camera.

4. The device according to claim 2, further comprising a measuring device for measuring an actual position of the slide while the slide is moved from the first location to the second location in order to synchronize a movement of the slide with a recording of the image lines of the single line camera.

5. The device according to claim 1, wherein the drive mechanism drives the slide with variable speed in first predetermined ranges and with constant speed in second predetermined ranges.

6. The device according to claim 2, wherein the drive mechanism drives the slide with variable speed in first predetermined ranges and with constant speed in second predetermined ranges.

7. The device according to claim 3, wherein the drive mechanism drives the slide with variable speed in first predetermined ranges and with constant speed in second predetermined ranges.

8. The device according to claim 4, wherein the drive mechanism drives the slide with variable speed in first predetermined ranges and with constant speed in second predetermined ranges.

* * * * *